(12) United States Patent
Ou

(10) Patent No.: US 7,834,655 B1
(45) Date of Patent: Nov. 16, 2010

(54) IMPEDANCE MATCHING DEVICE FOR MEMORY SIGNALS

(75) Inventor: Guang-Feng Ou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/551,474

(22) Filed: Aug. 31, 2009

(30) Foreign Application Priority Data

Aug. 12, 2009 (CN) .................. 2009 1 0305547

(51) Int. Cl.
*H03K 19/003* (2006.01)
*G11C 5/06* (2006.01)

(52) U.S. Cl. .............. 326/30; 326/31; 365/63

(58) Field of Classification Search ............ 326/30, 326/31, 21; 365/63
See application file for complete search history.

(56) References Cited

U.S. PATENT DOCUMENTS

| 6,308,232 | B1 * | 10/2001 | Gasbarro ............ 710/100 |
| 7,009,863 | B2 * | 3/2006 | Khatri et al. ........... 365/63 |
| 7,180,327 | B2 * | 2/2007 | So et al. ............ 326/30 |

* cited by examiner

*Primary Examiner*—James Cho
(74) *Attorney, Agent, or Firm*—Zhigang Ma

(57) ABSTRACT

An impedance matching device for memory signals includes a resistor array and a switch device. A number of first pins at a first side of the resistor array are connected to control signal pins and/or address signal pins of a memory socket on a motherboard. A number of second pins are extended at a second side of the resistor array. The switch device connects or disconnects the plurality of second pins of the resistor array to or from a power supply on the motherboard.

18 Claims, 3 Drawing Sheets

IMPEDANCE MATCHING DEVICE FOR MEMORY SIGNALS

BACKGROUND

1. Technical Field

The present disclosure relates to impedance matching devices, and particularly to an impedance matching device for memory signals of a motherboard.

2. Description of Related Art

Impedance matching is an electronics design practice of setting an input impedance of an electrical load equal to a fixed output impedance of a signal source to which it is ultimately connected, usually in order to maximize power transfer and minimize signal reflections from the electrical load.

Double data rate (DDR) 2 memory and DDR3 memory are both random access memory interface technology used for high bandwidth storage of working data of a computer or other digital electronic devices. DDR3 memory is an improvement over its predecessor, DDR2 memory, and the two are not compatible. A signal impedance matching method for the DDR2 memory is to connect signal pins of the DDR2 memory to a 0.9 volt (V) power supply via resistors. However, the DDR3 memory includes an inner impedance matching circuit. Signal pins of the DD3 memory are connected to a 0.75V power supply via the inner impedance matching circuit.

Installation of the DDR2 memory or the DDR3 memory to a motherboard capable of supporting both is the same, which means that signal pins of a memory socket for installing the DDR2 memory are used for the DDR3 memory to connect to a 0.9V power supply via resistors. Therefore, when the DDR3 memory is installed in the memory socket of the motherboard, signals of the DDR3 memory are impedance matched twice, once via the inner impedance matching circuit and again through the resistors, which results in reduced reliability of the signals of the DDR3 memory.

DETAILED DESCRIPTION

Figure 1:
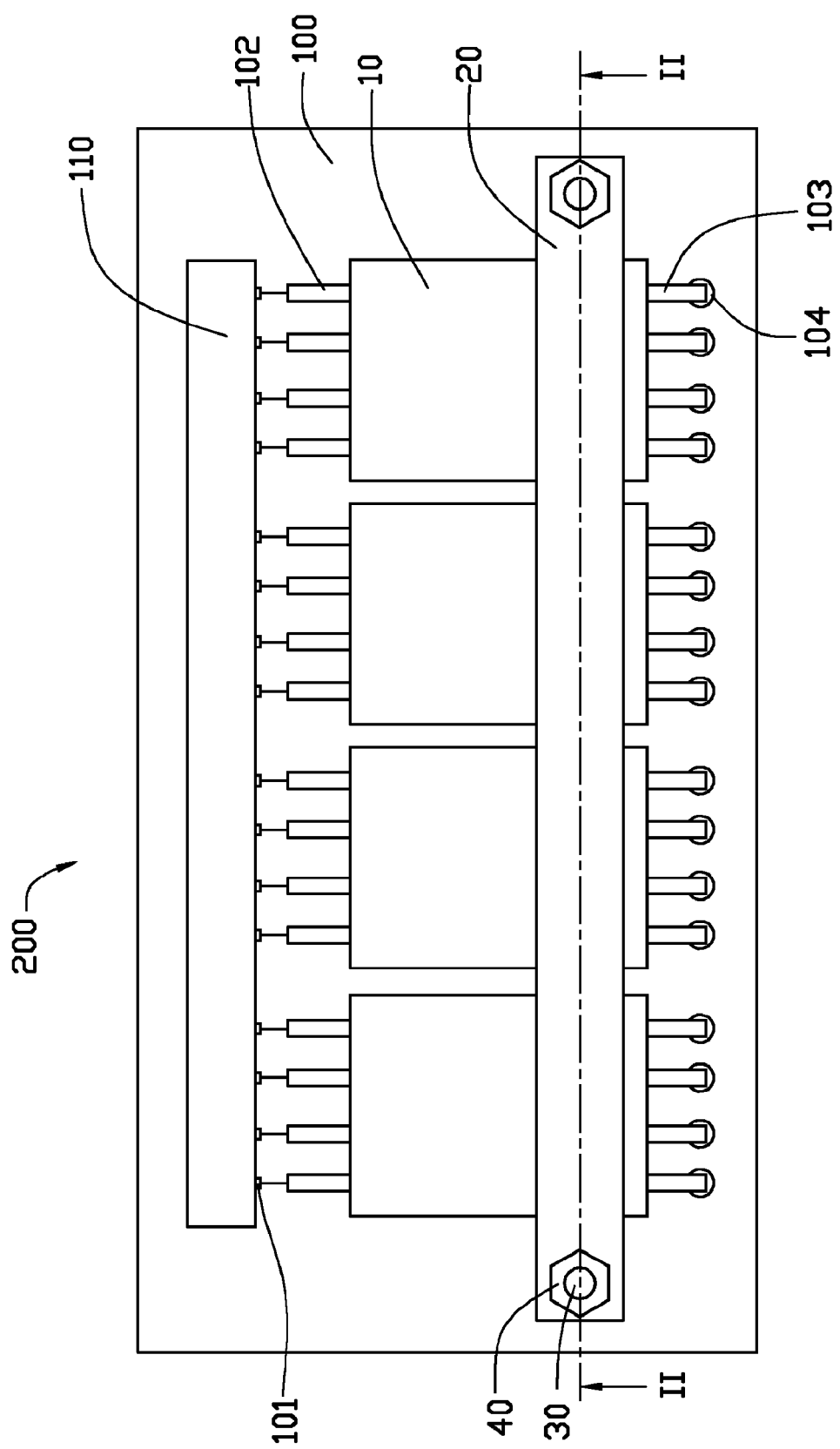
FIG. 1 is a plan view of an exemplary embodiment of an impedance matching device for memory signals.
Figure 2:
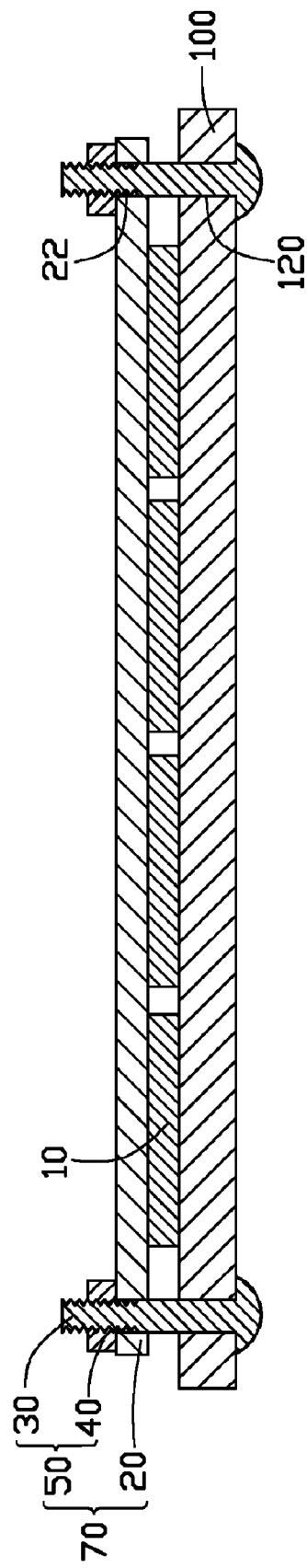
FIG. 2 is a cross-sectional, exploded view of the impedance matching device of FIG. 1, taken along the line II-II.

Referring to FIG. 1 and FIG. 2, an exemplary embodiment of an impedance matching device 200 for memory signals of different memories, such as a double data rate (DDR) 2 memory and a DDR3 memory, installed in a memory socket 110 of a motherboard 100, is shown. The impedance matching device 200 includes a resistor array 10 and a switch device 70.

A plurality of first pins 102 at a first side of the resistor array 10 are respectively connected to signal pins 101 of the memory socket 110 of the motherboard 100. The plurality of signal pins 102 of the memory socket 110 may be control signal pins and/or address signal pins, corresponding to control signal pins and/or address signal pins of the DDR2 memory or the DDR3 memory. A plurality of second pins 103 at a second side of the resistor array 10 are flexibly suspended over corresponding solder ball pads 104.

The switch device 70 includes a pressing device 20 and a fixing device 50. The pressing device 20 is closely mounted to a surface of the resistor array 10, adjacent to the plurality of second pins 103. Two first through holes 22 are respectively defined in opposite ends of the pressing device 20.

The fixing device 50 includes two screws 30 and two nuts 40. The motherboard 100 defines two second through holes 120, corresponding to the first through holes 22 of the pressing device 20. Each of two screws 30 passes through one of the second through holes 120 of the motherboard 100 and a corresponding first through hole 22 of the pressing device 20, to be screwed into one of the screw nuts 40, thereby to fix the pressing device 20 to the surface of the resistor array 10.

The pads 104 are connected to a 0.9 volt (V) power supply (not shown) provided by the motherboard 100. Further details about the use of the impedance matching device 200 will be explained below.

When a DDR2 memory is installed in the memory socket 110 of the motherboard 100, the pressing device 20 is adjusted via adjusting the screws 30 and the screw nuts 40 to make the pressing device 20 press the second pins 103 against the pads 104. Thereby, the plurality of second pins 103 of the resistor array 10 are connected to the 0.9V power supply of the motherboard 100 via the pads 104. Therefore, signals of the DDR2 memory are impedance matched via the resistor array 10.

When a DDR3 memory is installed in the memory socket 110 of the motherboard 100, the pressing device 20 are separated from the resistor array 10 by releasing the screw nuts 40 and the screws 30, thereby the plurality of second pins 103 of the resistor array 10 flex back above the pads 104. Therefore, signals of the DDR3 memory are only impedance matched via an inner impedance matching circuit of the DDR3 memory, without using the resistor array 10.

Figure 3:
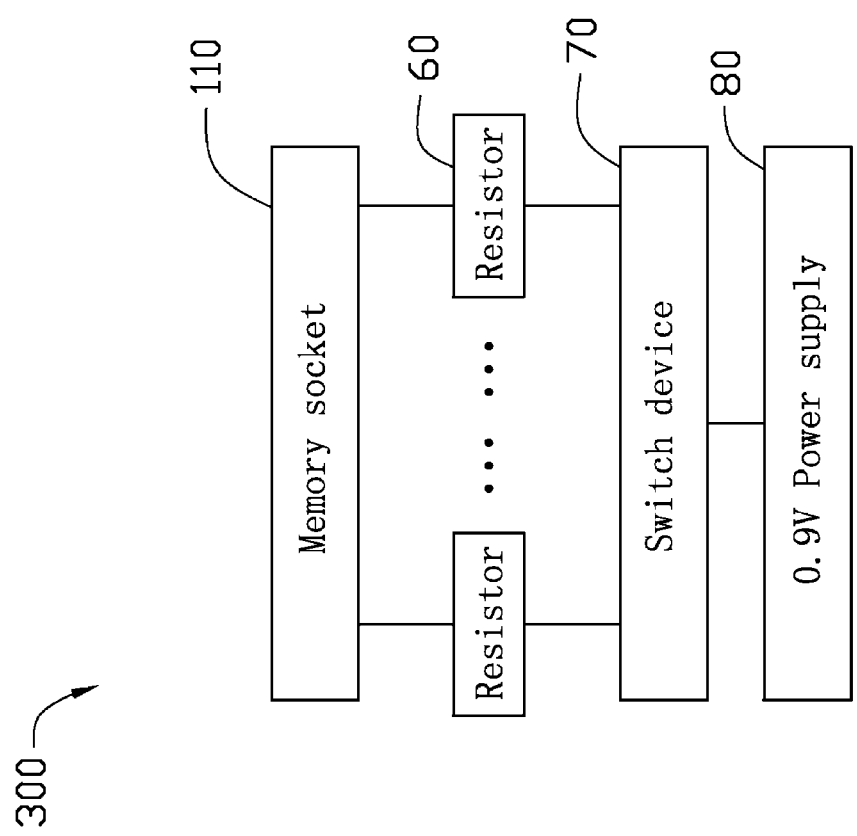
FIG. 3 is a block diagram of another exemplary embodiment of an impedance matching device for memory signals.

Referring to FIG. 3, in another exemplary embodiment, the resistor array 10 may be replaced by a plurality of resistors 60 in parallel. First pins of the plurality of resistors 60 are connected to signal pins of a memory socket 110. The switch device 70 is an electrical switch. A first end of the switch device 70 is connected to a 0.9V power supply 80. A second end of the switch device 70 is connected to second pins of the plurality of resistors 60. When a DDR2 memory is installed in the memory socket 110, the switch device 70 is turned on to connect signal pins of the memory socket 110 with the 0.9V power supply 80 via the plurality of resistors 60. When a DDR3 memory is installed in the memory socket 110, the switch device 70 is turned off to disconnect the signal pins of the memory socket 110 from the 0.9V power supply 80. Therefore, signals of the DDR3 memory are only impedance matched via an inner impedance matching circuit of the DDR3 memory.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An impedance matching device, comprising:
    a resistor array, wherein a plurality of first pins at a first side of the resistor array are connected to signal pins of a memory socket on a motherboard, and a plurality of second pins are extended from a second side of the resistor array; and a switch device to connect the plurality of second pins of the resistor array to a power supply when a first memory without an inner impedance matching circuit is installed in the memory socket, or to disconnect the plurality of second pins of the resistor array from a power supply when a second memory with an inner impedance matching circuit is installed in the memory socket.

2. The impedance matching device of claim 1, wherein the first memory is a double data rate (DDR) 2 memory.

3. The impedance matching device of claim 1, wherein the second memory is a double data rate (DDR) 3 memory.

4. The impedance matching device of claim 1, wherein the switch device comprises a pressing device mounted on a surface of the resistor array, adjacent to the plurality of second pins.

5. The impedance matching device of claim 4, wherein the switch device further comprises a fixing device to fix the resistor array, thereby to make the plurality of second pins of the resistor array connect with the power supply.

6. The impedance matching device of claim 5, wherein two through holes are respectively defined in opposite ends of the pressing device, the fixing device comprises two screws and two nuts, wherein each of the screws passes through the motherboard and one of the through holes to be screwed into one of the nuts, thereby to fix the pressing device to the surface of the resistor array.

7. The impedance matching device of claim 6, further comprising a plurality of solder ball pads formed on the motherboard, adjacent to the plurality of second pins of the resistor array and configured to connect the plurality of second pins with the power supply.

8. The impedance matching device of claim 1, wherein the resistor array comprises a plurality of resistors in parallel, and the switch device is an electrical switch, wherein first ends of the plurality of resistors function as the plurality of first pins of the resistor array, second ends of the plurality of resistors function as the plurality of second pins of the resistor array, wherein the electrical switch is connected between the second ends of the plurality of resistors and the power supply.

9. A motherboard, comprising:
a power supply;
a memory socket to be installed with a first memory without an inner impedance matching circuit or a second memory with an inner impedance matching circuit, and comprising signal pins corresponding to signal pins of the first memory or the second memory;
a resistor array, wherein a plurality of first pins at a first side of the resistor array are connected to signal pins of the memory socket, and a plurality of second pins are extended at a second side of the resistor array; and
a switch device to connect the plurality of second pins of the resistor array to the power supply in response to the memory socket being installed with the first memory, and to disconnect the plurality of second pins of the resistor array from the power supply in response to the memory socket being installed with the second memory.

10. The motherboard of claim 9, wherein the first memory is a double data rate (DDR) 2 memory.

11. The motherboard of claim 9, wherein the second memory is a double data rate (DDR) 3 memory.

12. The motherboard of claim 9, wherein the signal pins of the memory socket are control signal pins and/or address signal pins, corresponding to control signal pins and/or address signal pins of the first memory or the second memory.

13. The motherboard of claim 9, wherein the power supply is a 0.9 volt (V) power supply provided by the motherboard.

14. The motherboard of claim 9, wherein the switch device comprises a pressing device mounted on a surface of the resistor array, adjacent to the plurality of second pins.

15. The motherboard of claim 14, wherein the switch device further comprises a fixing device to fix the resistor array, thereby to make the plurality of second pins of the resistor array connect with the power supply.

16. The motherboard of claim 15, wherein two through holes are respectively defined in opposite ends of the pressing device, the fixing device comprises two screws and two nuts, wherein each of the screws passes through the motherboard and one of the through holes to be screwed into one of the nuts, thereby to fix the pressing device to the surface of the resistor array.

17. The motherboard of claim 16, further comprising a plurality of solder ball pads formed on the motherboard, adjacent to the plurality of second pins of the resistor array and configured to connect the plurality of second pins with the power supply.

18. The motherboard of claim 9, wherein the resistor array comprises a plurality of resistors in parallel, and the switch device is an electrical switch, wherein first ends of the plurality of resistors function as the plurality of first pins of the resistor array, second ends of the plurality of resistors function as the plurality of second pins of the resistor array, wherein the electrical switch is connected between the second ends of the plurality of resistors and the power supply.

* * * * *